United States Patent
Wu et al.

(10) Patent No.: US 6,884,646 B1
(45) Date of Patent: Apr. 26, 2005

(54) METHOD FOR FORMING AN LED DEVICE WITH A METALLIC SUBSTRATE

(75) Inventors: Bor-Jen Wu, Linkou (TW); Mei-Hui Wu, Minsyong (TW); Chien-An Chen, Sinihuang (TW); Yuan-Hsiao Chang, Taipei (TW)

(73) Assignee: Uni Light Technology Inc., Taoyuan Hsien (TW)

( * ) Notice: Subject to any disclaimer, the term of this patent is extended or adjusted under 35 U.S.C. 154(b) by 0 days.

(21) Appl. No.: 10/796,200

(22) Filed: Mar. 10, 2004

(51) Int. Cl.[7] .............................................. H01L 21/00
(52) U.S. Cl. .............................. 438/22; 438/28; 438/33
(58) Field of Search .............................. 438/22, 28, 29, 438/33

(56) References Cited

U.S. PATENT DOCUMENTS

2003/0189212 A1 * 10/2003 Yoo ............................ 257/79
2004/0077114 A1 * 4/2004 Coman et al. .............. 438/46
2004/0079951 A1 * 4/2004 Horng et al. ................ 257/79

* cited by examiner

*Primary Examiner*—Caridad Everhart
(74) *Attorney, Agent, or Firm*—Nath & Associates PLLC; Gary M. Nath; Gregory B. Kang

(57) ABSTRACT

An LED epitaxial structure and a first electrode layer are formed on a provisional substrate in sequence. Then, a metallic permanent substrate is formed on the first electrode layer, and the provisional substrate is removed to expose a surface of the LED epitaxial structure. A plurality of second electrodes is formed on the surface of the LED epitaxial structure. Finally, the metallic permanent substrate, the first electrode layer, and the LED epitaxial structure are diced to form a plurality of LED devices.

20 Claims, 4 Drawing Sheets

METHOD FOR FORMING AN LED DEVICE WITH A METALLIC SUBSTRATE

BACKGROUND OF THE INVENTION

1. Field of the Invention

This invention relates to a method for forming an LED device, and more particularly to a method for forming an LED device with a metallic substrate.

2. Description of the Prior Art

The working of an LED is to emit light by a current flow forward into an active layer of a semiconductor device. FIG. 1A shows a popular LED structure. In FIG. 1A, a P-type bonding pad 126 and an N-type bonding pad 118 are respectively formed above and below an LED epitaxial layer 110, which is formed on a substrate 117. The LED epitaxial layer 110 comprises an N-type semiconductor layer 112, an active layer 114, and a P-type semiconductor layer 116. A current 130 is injected from P-type bonding pad 126, passed through the P-type semiconductor layer 116, the active layer 114, the N-type semiconductor layer 112, and the substrate 117, and finally flowed out of the N-type bonding pad. Light is emitted while the current density in the active layer 114 reaches a threshold value. The N-type semiconductor layer 112, the active layer 114, and the P-type semiconductor layer 116 totally are called the LED epitaxial layer 110.

The structure mentioned above is a vertical structure, so the chip process is simple. Furthermore, the bonding step is easy in package process and the product yield is high because only one wire bonding is needed. Moreover, high power LEDs, which gained great attention lately in lighting applications, drive a larger current to generate a higher light output, and the larger current generates more heat. Therefore, the operating temperature of the high power LED structure is higher, and the lifetime and the reliability of the LED can be substantially decreased. Furthermore, the luminous efficiency is also reduced while the operating temperature of the LED structure rises. Hence, the high power LEDs must have a structure having a better thermal dissipation effect. Nevertheless, the conventional LED structure does not have a good thermal dissipation effect.

FIG. 1B shows a schematic diagram of a structure of GaN-based LED different from the structure as shown in FIG. 1A. The material of the substrate is sapphire, which is not conductive, different from the conductive substrate in FIG. 1A. In FIG. 1B, there are an N-type GaN semiconductor layer 132, an active layer 134, and a P-type GaN semiconductor layer 136 which are formed on a substrate 137 in sequence. Due to the substrate is not conductive, a P-type bonding pad 148 and an N-type bonding pad 146 must be formed on the same side of the substrate. Hence, a partial surface of the GaN epitaxial layer 140 (comprising the N-type GaN semiconductor layer 132, the active layer 134, and the P-type GaN semiconductor layer 136) is etched to expose a partial surface 133 of the N-type GaN semiconductor 132, and the N-type bonding pad 146 is formed on the surface 133. In addition, the electrical conductivity of P-type GaN semiconductor layer 136 is poor, and a semi-transparent contact layer 139 has to be formed on the P-type GaN semiconductor layer 136 to enhance the current spreading.

The aforementioned structure is not a vertical structure. Compared with the structure as shown in FIG. 1A, the chip process is more complicated. Moreover, such structure has two pads on its front surface, so the package process is more complicated and the overall yield can be lower. Besides, the thermal dissipation effect and the electrostatic discharge effect are not satisfactory due to the substrate is not conductive.

In the conventional arts, a structure as shown in FIG. 1A is further formed a permanent substrate on an opposite surface to the substrate and then the substrate is removed. Therefore, the material of the permanent substrate can be appropriately selected, such as a material having better optical transparency, better electrical conductivity or better thermal dissipation effect. However, the permanent substrate is formed on the LED epitaxial layer by wafer bonding, and the wafer bonding must be conducted under high temperature and high pressure conditions, thus the yield of the LED is relatively low.

SUMMARY OF THE INVENTION

The present invention has been made in view of the above problems in the prior arts, and it is an objective of the present invention to provide a method for forming an LED having a metallic substrate. The present invention employs to form a metallic permanent substrate on the LED to form an LED structure having a good thermal dissipation effect.

Another objective of present invention is to provide a method for forming an LED having a metallic substrate. The present invention employs to form a metallic permanent substrate on the LED to form an LED structure to withstand higher electrostatic discharge.

Still another objective of present invention is to provide a method of forming an LED having a metallic substrate. The LED is a vertical structure and has a single pad for bonding, therefore the LED can be easily formed and the structure is simple.

Still further another objective of present invention is to provide a method for forming an LED having a good thermal dissipation effect, so that the LED can be operated at higher current to effectively raise the light output efficiency.

Still another objective of present invention is to provide a method for forming an LED, which needs only one wire bonding and the chip process thereof is simple, for raising the yield of the LED.

As aforementioned, the present invention provides a method for forming an LED device with a metallic substrate comprising the below steps. First, a provisional substrate is provided. Then, an LED epitaxial structure and a first electrode layer are formed on the provisional substrate in sequence. Next, a metallic permanent substrate is formed on the first electrode layer. After that, the provisional substrate is removed to expose a surface of the LED epitaxial structure. Subsequently, a plurality of second electrodes is formed on the surface of the LED epitaxial structure. Finally, the metallic permanent substrate, the first electrode layer, and the LED epitaxial structure are cut to form a plurality of LEDs.

The present invention also provides a method for forming an LED device with a metallic substrate comprising the following steps. First, a provisional substrate is provided. Then, an LED epitaxial structure is formed on the provisional substrate. Next, the LED chip areas are defined by etching part of the epitaxial structure down to the provisional substrate and a plurality of first electrodes is formed on the plurality of LED epitaxial chips, respectively. Subsequently, a dielectric layer is formed to fill up the space among the plurality of LED epitaxial chips. Then, a metallic permanent substrate is formed on the plurality of LED epitaxial chips and the dielectric layer. Next, the provisional substrate is removed to expose surfaces of the plurality of LED epitaxial chips. After that, the dielectric layer is removed. Subsequently, a plurality of second electrodes is formed on the surfaces of the plurality of LED epitaxial structures, respectively. Finally, the metallic permanent substrate is cut to form a plurality of LEDs.

The present invention also still provides a method for forming an LED device with a metallic substrate as described in the following. Firstly, a provisional substrate is provided. Then, an LED epitaxial structure is formed on the provisional substrate. Subsequently, part of the LED epitaxial structure is etched until the provisional substrate to define a plurality of LED chip areas. After that, a plurality of first electrodes layer is formed on the plurality of LED epitaxial chips, respectively. Next, a first dielectric layer is formed to fill up the space among the plurality of LED epitaxial chips. After that, a conduction enhancing layer is formed to cover the first electrodes layer and the first dielectric layer. Then, a second dielectric layer is formed on a region of the conduction enhancing layer corresponding to the first dielectric layer in vertical direction. Subsequently, a metallic permanent substrate is formed on the conduction enhancing layer to fill up the space among the second dielectric layer. Then, the provisional substrate is removed to expose surfaces of the plurality of LED epitaxial chips. Next, the first dielectric layer is removed. After that, a plurality of second electrodes is formed on the surfaces of the plurality of LED epitaxial structures, respectively. After that, the second dielectric layer is removed. Finally, the conduction enhancing layer is cut to form a plurality of LEDs.

DESCRIPTION OF THE PREFERRED EMBODIMENT

Some sample embodiments of the invention will now be described in greater detail. Nevertheless, it should be recognized that present invention can be practiced in a wide range of other embodiments besides those explicitly described, and the scope of the present invention is expressly not limited expect as specified in the accompanying claims.

Note that, the components of the different elements are not shown to scale. Some dimensions of the related components are exaggerated to provide a more clear description and comprehension of the present invention.

An aspect of the present invention is to form a metallic permanent substrate on an epitaxial structure and to remove the provisional substrate from the epitaxial structure. The metallic permanent substrate is not only more thermally conductive to enhance the removal of the heat generated during the LED operation, but also more electrically conductive to provide a good effect, to prevent electro-static discharge. Furthermore, the LED structure of the present invention is a vertical structure and has only a single pad. Hence, the device structure is simple and the yield for packaging can be greatly improved.

In addition, the forming yield of the present invention can be improved by the formation of pre-cut trench in some layers of the LED structure to reduce the stress of lifted-off epitaxial layer. The LED structure of the present invention is more easily divided.

A GaN-based LED having an epitaxial layer formed on a sapphire is used as example in the present invention. The permanent substrate can be formed by electroplating, metal cool-forming, evaporation, or sputtering in the present invention. The embodiments are described with electroplating method, and the forming method of the permanent substrate should not be limited to this.

FIG. 2A to FIG. 2G are schematic diagrams of respective steps of the first preferred embodiment in the present invention.

Figure 1A:
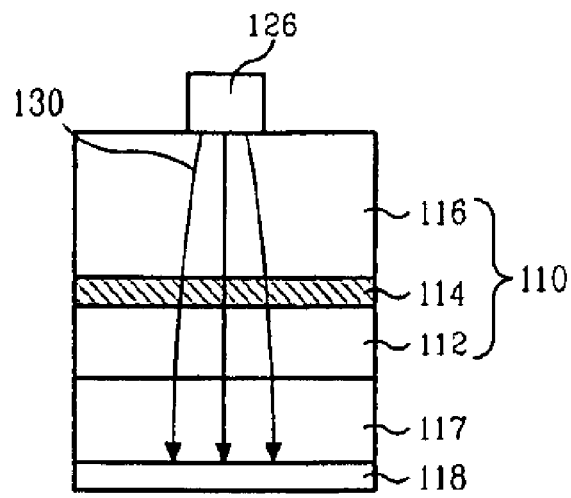
FIG. 1A to FIG. 1B are schematic diagrams of LED structures in the conventional arts.
Figure 1B:
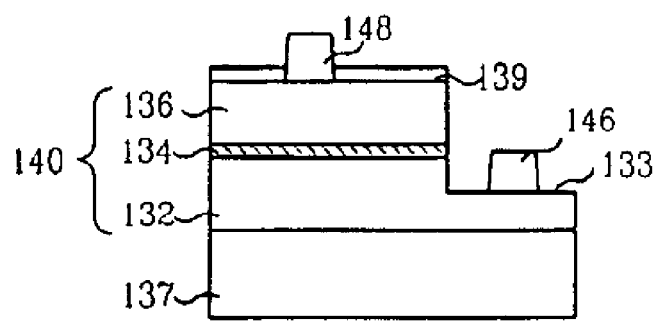
Figure 2A:
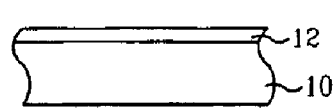
FIG. 2A to FIG. 2G are schematic diagrams of respective steps of one preferred embodiment in the present invention.

First, as shown in FIG. 2A, an LED epitaxial structure 12 is formed on a provisional substrate 10. The LED epitaxial structure 12 comprises at least an N-type semiconductor layer, an active layer, and a P-type semiconductor layer in sequence. Then, as shown in FIG. 2B, a first electrode layer 14 is formed on the LED epitaxial structure 12. A good ohmic contact is formed between the first electrode layer 14 and the LED epitaxial structure 12, so the contact resistance is reduced and a current can be injected into all LED structure efficiently. The preferable material of the first electrode layer 14 is NiO and Au. Next, a conduction enhancing layer 16 is formed on the first electrode layer 14, as shown in FIG. 2C. The main function of the conduction enhancing layer 16 is to assist the formation of a metallic permanent substrate 20. For example, the conduction enhancing layer 16 can be a seed layer for the successive electroplating step to form the metallic permanent substrate 20. As aforementioned, the metallic permanent substrate 20 can be formed by other methods other than the electroplating method in the present invention, and therefore the forming step of the conduction enhancing layer 16 can be optional.

Figure 2F:
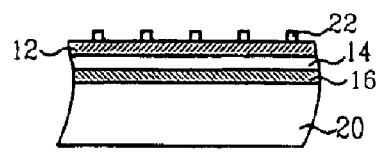
Figure 2B:
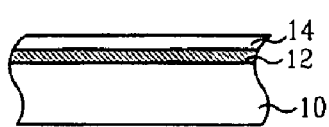
Figure 2G:
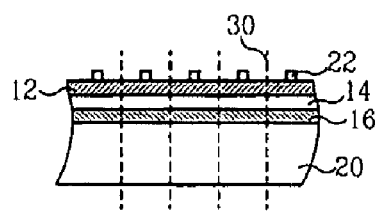
Figure 2C:
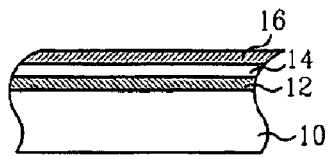
Figure 2D:
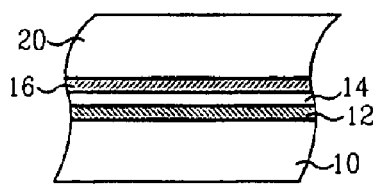

Subsequently, the metallic permanent substrate 20 is formed on the conduction enhancing layer 16, as shown in FIG. 2D. The materials of the metallic permanent substrate 20 is selected according to the requirement of the LED, and the preferable material comprises Ag, Ni, Ti, Cr, Pt, Pd, Zn, Al, In, Sn, Cu, Au, Mo, Mg, the alloy thereof, or a multilayer thereof. These metals have respective proper forming methods. For example, Au, Pt, Cr, Pd, Al, Zn, Ni, Ti, Mo, Mg, and the alloy thereof are preferably formed by evaporation or sputtering; Ni, Cr, Zn, Sn, Cu, Au, Mo, Mg, and Ag are preferably formed by electroplating; and Pd, In, Sn, and the alloy thereof are preferably by metal cool-forming. The preferable thickness range of the permanent substrate 20 is 10 $\mu$m to 300 $\mu$m, and 40 $\mu$m to 150 $\mu$m is more preferable.

Figure 2E:
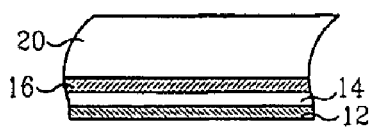

After that, the provisional substrate 10 is removed, as shown in FIG. 2E. The removing method for the provisional substrate 10 can be a selectively etching method, a lapping/polishing method, a wafer lift-off method, or the combination thereof. After the provisional substrate 10 is removed, a surface of the LED epitaxial structure 12 which is originally in contact with the provisional substrate 10 is exposed.

Referring to FIG. 2F, the LED structure is reversed to make the exposed surface of the LED epitaxial structure 12 upward, and then a plurality of second electrode 22 is formed on the surface. Each of the plurality of second electrode 22 corresponds to a desired LED chip. Finally, the LED structure (comprising the metallic permanent substrate 20, the conduction enhancing layer 16, the first electrode layer 14, and the LED epitaxial structure 12) is cut along the cutting line 30 to form a plurality of LED.

FIG. 3A to FIG. 3J are schematic diagrams of respective steps of second preferred embodiment in the present invention. Compared with the first embodiment as shown in FIG. 2A–FIG. 2G, the epitaxial structure can be easily lifted-off due to that the area of the LED chips are predetermined and thus the build up of mechanical and/or thermal stress during the provisional substrate removal step can be substantially reduced as shown in FIG. 3A to FIG. 3J. Moreover, the cutting step only needs to cut the metallic substrate layer, so the cutting step can be easily performed.

Figure 3A:
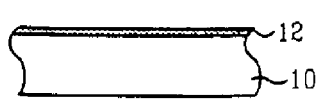
FIG. 3A to FIG. 3J are schematic diagrams of respective steps of another preferred embodiment in the present invention.
Figure 3F:
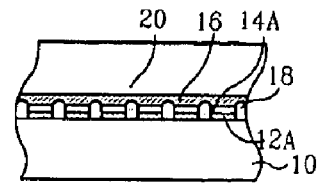
Figure 3B:
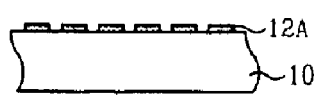

As shown in FIG. 3A and FIG. 3B, an LED epitaxial structure 12 is formed on a provisional substrate 10 and then the LED epitaxial structure 12 is etched until the provisional substrate 10 to form LED device 12A. Then, as shown in FIG. 3C, each of first electrodes layer 14A is formed on each of the LED devices 12A, respectively. The preferable material of the first electrodes layer 14A is NiO and Au so as to form a good ohmic contact with the LED device 12A to reduce the contact resistance. The steps of etching the LED epitaxial structure 12 and forming the first electrodes layer 14A can be exchange without affecting the forming of the LED of the present invention.

Next, a dielectric layer 18 is formed to fill up the spaces among the LED device 12A until that the dielectric layer 18 is approximately the same height as the LED device 12A. After that, a conduction enhancing layer 16 is formed on the first electrodes layer 14A and the dielectric layer 18, as shown in FIG. 3D and FIG. 3E. The metallic permanent substrate 20 can be formed by the electroplating method or other methods in the present invention, and therefore the forming step of the conduction enhancing layer 16 can be optional. The preferable materials of the dielectric layer 18 comprise $SiO_2$, $Si_3N_4$, spin on glass (SOG), photoresist, and polymer. The polymer can be but not limited to ABS resin, epoxy, PMMA, acrylonitirle butadiene styrene copolymer, polymethyl methacrylate or a thermoplastic polymer comprising polysulfones, polyetherimides, polyimides, polythersulfone, polyamideimide, polyphenylene sulfide.

Subsequently, the metallic permanent substrate 20 is formed on the conduction enhancing layer 16, as shown in FIG. 3F. A material of the metallic permanent substrate 20 is selected according to the requirement of the LED, and the metallic permanent substrate 20 comprises Ag, Ni, Ti, Cr, Pt, Pd, Zn, Al, In, Sn, Cu, Au, Mo, Mg, the alloy thereof, or a multi-layer of thereof. Same as above, these metals have respective proper forming methods, for example: evaporation, sputtering, electroplating, and metal cool-forming.

Figure 3G:
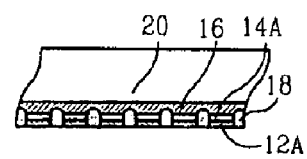
Figure 3C:

After that, the provisional substrate 10 is removed, as shown in FIG. 3G. The removing method for the provisional substrate 10 can be a selectively etching method, a lapping/polishing method, a wafer lift-off method, or the combination thereof. After the provisional substrate 10 is removed, surfaces of the LED devices 12A which are originally in contact with the provisional substrate 10 are exposed.

Figure 3H:
Figure 3D:
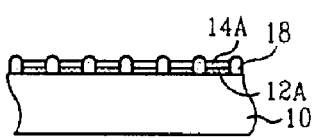
Figure 3I:
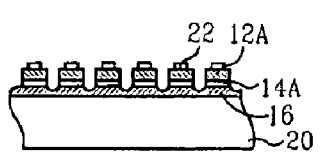
Figure 3E:
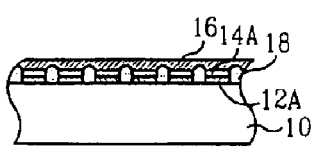
Figure 3J:
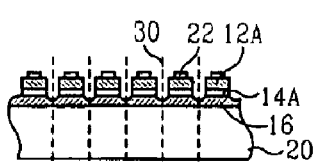

Referring to FIG. 3H and FIG. 3I, the LED structure is reversed to make the exposed surfaces of the LED devices 12A upward, and then a plurality of second electrode 22 is formed on the surfaces of the LED devices 12A, respectively. Next, the dielectric layer 18 among the LED devices 12A is removed. The steps of removing the dielectric layer 18 and forming the second electrode 22 can be exchange without affecting the forming of the LED. Finally, as shown in FIG. 3J, the LED structure (comprising the metallic permanent substrate 20 and the conduction enhancing layer 16) is cut along the cutting line 30 to form a plurality of LED.

FIG. 4A to FIG. 4L are schematic diagrams of respective steps of the third preferred embodiment in the present invention.

Figure 4A:
FIG. 4A to FIG. 4L are schematic diagrams of respective steps of still another preferred embodiment in the present invention.
Figure 4G:
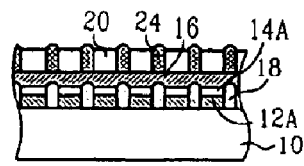
Figure 4B:
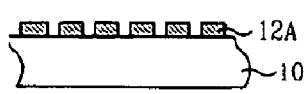
Figure 4H:
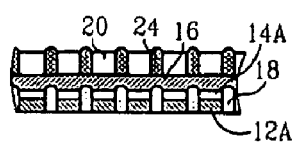
Figure 4C:

Referring to FIG. 4A to FIG. 4C, an LED epitaxial structure 12 is formed on a provisional substrate 10, the LED epitaxial structure 12 is etched until the provisional substrate 10 to form LED device 12A and then each of first electrodes layer 14A is formed on each of the LED devices 12A, respectively. The preferable material of the first electrode layer 14A is NiO and Au so as to form a good ohmic contact with the LED device 12A to reduce the contact resistance. The steps of etching the LED epitaxial structure 12 and forming the first electrodes layer 14A can be exchange without affecting the forming of the LED of the present invention.

Then, a first dielectric layer 18 is form to fill up the space among the LED devices 12A until that the dielectric layer 18 is approximately the same height as the LED device 12A. After that, a conduction enhancing layer 16 is formed on the first electrodes layer 14A and the dielectric layer 18, as shown in FIG. 4D and FIG. 4E. Similarly, the metallic permanent substrate 20 can be formed by the electroplating method or other method in the present invention.

Figure 4I:
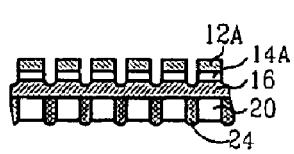
Figure 4D:
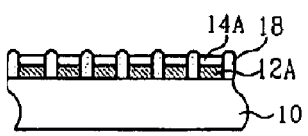
Figure 4J:
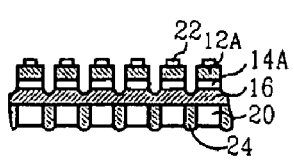
Figure 4E:
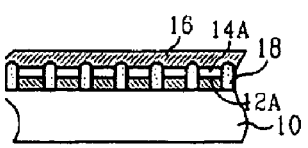
Figure 4:
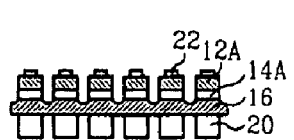
Figure 4F:
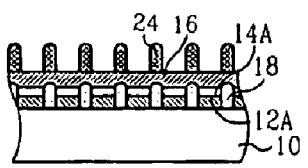

Next, as shown in FIG. 4F, a second dielectric layer 24 is formed on the conduction enhancing layer 16. The second dielectric layer 24 is formed corresponding to the first dielectric layer 18 in vertical direction. In general, a thickness of second dielectric layer 24 is nearly a thickness of the permanent substrate 20. The preferable thickness range of the second dielectric layer 24 is 10 $\mu$m to 300 $\mu$m, and a more preferable thickness range thereof is 40 $\mu$m to 150 $\mu$m.

The preferable materials of the first dielectric layer 18 and the second dielectric layer 24 comprise $SiO_2$, $Si_3N_4$, SOG, photoresist, and polymer. The polymer can be ABS resin, epoxy, PMMA, acrylonitirle butadiene styrene copolymer, polymethyl methacrylate or a thermoplastic polymer comprising polysulfones, polyetherimides, polyimides, polythersulfone, polyamideimide, polyphenylene sulfide.

Subsequently, the metallic permanent substrate 20 is formed to fill up the space among the second electrode layer 24 until that the metallic permanent substrate 20 is approximately as tall as the second electrode layer 24, as shown in FIG. 4G. A material of the metallic permanent substrate 20 is selected according to the requirement of the LED, and the metallic permanent substrate 20 comprises Ag, Ni, Ti, Cr, Pt, Pd, Zn, Al, In, Sn, Cu, Au, Mo, Mg, the alloy thereof, or a multi-layer thereof. Same as above, these metals have respective proper forming methods, for example: evaporation, sputtering, electroplating, and metal cool-forming and their combination.

After that, the provisional substrate 10 is removed, as shown in FIG. 4H. The removing method for the provisional substrate 10 can be a selectively etching method, a lapping/polishing method, a wafer lift-off method, or the combination thereof. After the provisional substrate 10 is removed, surfaces of the LED devices 12A which are originally in contact with the provisional substrate 10 are exposed.

Referring to FIG. 4I and FIG. 4J, the LED structure is reversed to make the exposed surfaces of the LED devices 12A upward, and then a plurality of second electrode 22 is formed on the surfaces of the LED devices 12A, respectively. Next, the first dielectric layer 18 among the LED devices 12A is removed. Similarly, the steps of removing the first dielectric layer 18 and forming the second electrode 22 can be exchange without affecting the forming of the LED.

Figure 4L:
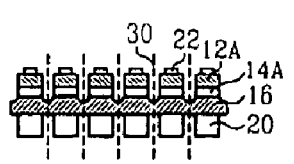

Finally, the second dielectric layer 24 is removed and the LED structure (i.e., the conduction enhancing layer 16) is cut along the cutting line 30 to form a plurality of LED, as shown in FIG. 4K and FIG. 4L. Because the conduction enhancing layer 16 is thin and easily cut off, the LEDs can be divided into with only a slight force.

In addition, in the present invention, the N-type semiconductor layer of the LED epitaxial structure 12 is contacted with the second electrode layer 22, i.e., the exposed surface of the LED epitaxial structure 12 is one surface of the N-type semiconductor layer. Due to the N-type semiconductor layer of the present invention has a good current spreading effect, a current spreading layer need not be formed between the N-type semiconductor layer and the second electrode layer 22. Naturally, the current spreading layer between the N-type semiconductor layer and the second electrode layer 22 can be optionally formed in the present invention to boost the current spreading into the LED anywhere for increasing the total light of the LED.

In the present invention, a metallic permanent substrate is formed on an LED structure, and the heat generated during the LED being operated can be took away rapidly due to the better thermal conductivity of metal, so the operating temperature is reduced. As a result, the maximum current of the LED can be efficiently raised.

Moreover, due to the material of the permanent substrate is metal, it also act as a protecting layer against static electricity to reduce the risk to the damage of static electricity generated during the manufacturing process of the LED. The LED structure of the present invention is a vertical structure and has a single pad, so the LED is easily formed and the structure is simple to improve the package yield.

Although specific embodiments have been illustrated and described, it will be obvious to those skilled in the art that various modifications may be made without departing from what is intended to be limited solely by the appended claims.

What is claimed is:

1. A method for forming an LED device with a metallic substrate, comprising the steps of:

providing a provisional substrate;
   forming an LED epitaxial structure and a first electrode layer on said provisional substrate in sequence;
   forming a metallic permanent substrate on said first electrode layer;
   removing said provisional substrate to expose a surface of said LED epitaxial structure;
   forming a plurality of second electrodes on said surface of said LED epitaxial structure; and
   dicing said metallic permanent substrate, said first electrode layer, and said LED epitaxial structure to form a plurality of LEDs.

2. The method in claim 1, further comprising a step of forming a conduction enhancing layer between said first electrode layer and said metallic permanent substrate.

3. The method in claim 2, wherein the step of forming said metallic permanent substrate is accomplished by electroplating, metal cool-forming, evaporation, sputtering, or the combination thereof.

4. The method in claim 3, wherein said metallic permanent substrate is Ag, Ni, Ti, Cr, Pt, Pd, Zn, Al, In, Sn, Cu, Au, Mo, Mg, an alloy thereof, or a multi-layer thereof.

5. The method in claim 2, wherein the provisional substrate removing step is accomplished by selectively etching, lapping/polishing, wafer lift-off, or the combination thereof.

6. A method for forming an LED device with a metallic substrate, comprising the steps of:

providing a provisional substrate;
   forming an LED epitaxial structure on said provisional substrate;
   etching said LED epitaxial structure until said provisional substrate to form a plurality of LED epitaxial chips;
   forming a plurality of first electrodes layer on said plurality of LED epitaxial chips, respectively;
   forming a dielectric layer to fill up the space among said plurality of LED epitaxial chips;
   forming a metallic permanent substrate on said plurality of LED epitaxial chips and said dielectric layer;
   removing said provisional substrate to expose surfaces of said plurality of LED epitaxial chips;
   removing said dielectric layer;
   forming a plurality of second electrodes on said surfaces of said plurality of LED epitaxial structures, respectively; and
   dicing said metallic permanent substrate to form a plurality of LEDs.

7. The method in claim 6, further comprising a step of forming a conduction enhancing layer between said first electrodes layer and said metallic permanent substrate.

8. The method in claim 7, wherein the step of forming said metallic permanent substrate is accomplished by electroplating, metal cool-forming, evaporation, sputtering, or the combination thereof.

9. The method in claim 8, wherein said metallic permanent substrate is Ag, Ni, Ti, Cr, Pt, Pd, Zn, Al, In, Sn, Cu, Au, Mo, Mg, an alloy thereof, or a multi-layer thereof.

10. The method in claim 7, wherein the provisional substrate removing step is accomplished by selectively etching, lapping/polishing, wafer lift-off, or the combination thereof.

11. The method in claim 7, wherein the material of said dielectric layer is $SiO_2$, $Si_3N_4$, SOG, photoresist, polymer, or the combination thereof.

12. The method in claim 11, wherein the material of polymer is ABS resin, epoxy, PMMA, acrylonitirle butadiene styrene copolymer, polymethyl methacrylate, polysulfones, polyetherimides, polyimides, polythersulfone, polyamideimide, or polyphenylene sulfide.

13. A method for forming an LED device with a metallic substrate, comprising the steps of:

providing a provisional substrate;
   forming an LED epitaxial structure on said provisional substrate;
   etching said LED epitaxial structure until said provisional substrate to form a plurality of LED epitaxial chips;
   forming a plurality of first electrodes layer on said plurality of LED epitaxial chips, respectively;
   forming a first dielectric layer to fill up the space among said plurality of LED epitaxial chips;
   forming a conduction enhancing layer to cover said first electrodes layer and said first dielectric layer;
   forming a second dielectric layer on a region of said conduction enhancing layer corresponding to said first dielectric layer in vertical direction;
   forming a metallic permanent substrate on said conduction enhancing layer to fill up the space among said second dielectric layer;
   removing said provisional substrate to expose surfaces of said plurality of LED epitaxial chips;

removing said first dielectric layer;

forming a plurality of second electrodes on said surfaces of said plurality of LED epitaxial structures, respectively;

removing said second dielectric layer; and dicing said conduction enhancing layer to form a plurality of LEDs.

14. The method in claim 13, wherein the step of forming said metallic permanent substrate is accomplished by electroplating, metal cool-forming, evaporation, sputtering, or the combination thereof.

15. The method in claim 13, wherein the material of said metallic permanent substrate is Ag, Ni, Ti, Cr, Pt, Pd, Zn, Al, In, Sn, Cu, Au, Mo, Mg, an alloy thereof, or a multi-layer thereof.

16. The method in claim 13, wherein the provisional substrate removing step is accomplished by selectively etching, lapping/polishing, wafer lift-off, or the combination thereof.

17. The method in claim 13, wherein the material of said first dielectric layer is $SiO_2$, $Si_3N_4$, SOG, photoresist, polymer, or the combination.

18. The method in claim 17, wherein the material of polymer is ABS resin, epoxy, PMMA, acrylonitirle butadiene styrene copolymer, polymethyl methacrylate, polysulfones, polyetherimides, polyimides, polythersulfone, polyamideimide, or polyphenylene sulfide.

19. The method in claim 13, wherein the material of said second dielectric layer is $SiO_2$, $Si_3N_4$, SOG, photoresist, polymer, or the combination thereof.

20. The method in claim 19, wherein the material of polymer is ABS resin, epoxy, PMMA, acrylonitirle butadiene styrene copolymer, polymethyl methacrylate, polysulfones, polyetherimides, polyimides, polythersulfone, polyamideimide, or polyphenylene sulfide.

* * * * *